United States Patent [19]
Sugg et al.

[11] Patent Number: 5,989,730
[45] Date of Patent: *Nov. 23, 1999

[54] ARTICLE HAVING A DECORATIVE AND PROTECTIVE MULTI-LAYER COATING

[75] Inventors: Rolin W. Sugg, Reading, Pa.; Richard P. Welty, Boulder, Colo.; Stephen R. Moysan, III, Douglasville, Pa.

[73] Assignee: Masco Corporation, Taylor, Mich.

[*] Notice: This patent is subject to a terminal disclaimer.

[21] Appl. No.: 08/848,210

[22] Filed: Apr. 30, 1997

[51] Int. Cl.⁶ .................................... B21D 39/00
[52] U.S. Cl. ................... 428/621; 428/627; 428/628; 428/629; 428/635; 428/648; 428/660; 428/675; 428/680
[58] Field of Search ..................... 428/627, 628, 428/629, 635, 680, 675, 660, 648, 621

[56] References Cited

U.S. PATENT DOCUMENTS

| | | | |
|---|---|---|---|
| 2,316,303 | 4/1943 | Wesley et al. | 428/611 |
| 2,432,893 | 12/1947 | Holt | 205/256 |
| 2,653,128 | 9/1953 | Brenner | 205/238 |
| 2,926,124 | 2/1960 | Taylor | 205/252 |
| 3,090,733 | 5/1963 | Brown | 428/639 |
| 3,771,972 | 11/1973 | Schaer et al. | 428/613 |
| 3,772,168 | 11/1973 | Dillenberg | 205/253 |
| 3,887,444 | 6/1975 | Fueki et al. | 205/253 |
| 3,940,319 | 2/1976 | Pollack | 205/253 |
| 4,029,556 | 6/1977 | Monaco et al. | 205/143 |
| 4,033,835 | 7/1977 | Lerner et al. | 205/253 |
| 4,049,508 | 9/1977 | Morrissey | 205/252 |
| 4,226,082 | 10/1980 | Nishida | 368/285 |
| 4,252,862 | 2/1981 | Nishida | 428/627 |
| 4,418,125 | 11/1983 | Henricks | 428/639 |
| 4,556,607 | 12/1985 | Sastri | 428/627 |
| 4,591,418 | 5/1986 | Snyder | 204/192.16 |
| 4,632,857 | 12/1986 | Mallory, Jr. | 428/209 |
| 4,640,869 | 2/1987 | Loth | 428/469 |
| 4,699,850 | 10/1987 | Kishi et al. | 428/469 |
| 4,761,346 | 8/1988 | Naik | 428/627 |
| 4,791,017 | 12/1988 | Hofmann et al. | 428/216 |
| 4,847,445 | 7/1989 | Helderman et al. | 174/256 |
| 4,849,303 | 7/1989 | Graham et al. | 428/670 |
| 4,911,798 | 3/1990 | Abys et al. | 205/238 |
| 4,925,394 | 5/1990 | Hayashi et al. | 439/86 |
| 5,024,733 | 6/1991 | Abys et al. | 205/257 |
| 5,102,509 | 4/1992 | Albon et al. | 205/257 |
| 5,178,745 | 1/1993 | Abys et al. | 205/219 |
| 5,250,105 | 10/1993 | Gomes et al. | 106/1.11 |
| 5,314,608 | 5/1994 | Caballero | 205/238 |
| 5,413,874 | 5/1995 | Moysan, III et al. | 428/627 |
| 5,476,724 | 12/1995 | Moysan, III et al. | 428/627 |
| 5,478,659 | 12/1995 | Moysan, III et al. | 428/627 |
| 5,478,660 | 12/1995 | Moysan, III et al. | 428/627 |
| 5,482,788 | 1/1996 | Moysan, III et al. | 428/627 |
| 5,484,663 | 1/1996 | Moysan, III et al. | 428/627 |
| 5,552,233 | 9/1996 | Moysan | 428/627 |
| 5,626,972 | 5/1997 | Moysan, III et al. | 428/627 |
| 5,639,564 | 6/1997 | Moysan, III et al. | 428/627 |
| 5,641,579 | 6/1997 | Moysan, III et al. | 428/627 |
| 5,648,179 | 7/1997 | Moysan | 428/627 |
| 5,654,108 | 8/1997 | Moysan, III et al. | 428/627 |
| 5,667,904 | 9/1997 | Moysan | 428/627 |

FOREIGN PATENT DOCUMENTS

| | | |
|---|---|---|
| 56-166063 | 12/1981 | Japan . |
| 59-9189 | 1/1984 | Japan . |

OTHER PUBLICATIONS

Electroplating, Frederick A. Lowenheim, pp. 210–225, 1978, McGraw–Hill Book Company.

Modern Electroplating, Frederick A. Lowenheim, The Electrochemical Society, Inc., NY, 1942, pp. 279, 280.

*Primary Examiner*—Leszek Kiliman
*Attorney, Agent, or Firm*—Myron B. Kapustij; Lloyd D. Doigan

[57] ABSTRACT

An article is coated with a multi-layer coating comprising a nickel layer, a tin-nickel alloy layer, a non-precious refractory metal layer, a sandwich layer comprised of a plurality of alternating layers of non-precious refractory metal compound and of a non-precious refractory metal, a non-precious refractory metal compound layer, and a layer comprised of a non-precious refractory metal oxide or the reaction products of a non-precious refractory metal, oxygen and nitrogen.

60 Claims, 1 Drawing Sheet

ARTICLE HAVING A DECORATIVE AND PROTECTIVE MULTI-LAYER COATING

FIELD OF THE INVENTION

The present invention relates to articles, in particular brass articles, coated with a multi-layer decorative and protective coating.

BACKGROUND OF THE INVENTION

It is currently the practice with various brass articles such as lamps, trivets, candlesticks, door knobs, door handles, door escutcheons and the like to first buff and polish the surface of the article to a high gloss and to then apply a protective organic coating, such as one comprised of acrylics, urethanes, epoxies, and the like, onto this polished surface. While this system is generally quite satisfactory it has the drawback that the buffing and polishing operation, particularly if the article is of a complex shape, is labor intensive. Also, the known organic coatings are not always as durable as desired, particularly in outdoor applications where the articles are exposed to the elements and ultraviolet radiation. It would, therefore, be quite advantageous if brass articles, or indeed other metallic articles, could be provided with a coating which gave the article the appearance of highly polished brass and also provided wear resistance and corrosion protection. The present invention provides such a coating.

SUMMARY OF THE INVENTION

The present invention is directed to a metallic substrate having a multi-layer coating disposed or deposited on its surface. More particularly, it is directed to a metallic substrate, particularly brass, having deposited on its surface multiple superposed metallic layers of certain specific types of metals or metal compounds. The coating is decorative and also provides corrosion and wear resistance. The coating provides the appearance of highly polished brass, i.e. has a brass color tone. Thus, an article surface having the coating thereon simulates a highly polished brass surface.

A first layer deposited directly on the surface of the substrate is comprised of nickel. The first layer may be monolithic or it may consist of two different nickel layers such as a semi-bright nickel layer deposited directly on the surface of the substrate and a bright nickel layer superimposed over the semi-bright nickel layer. Disposed over the nickel layer is a layer comprised of tin-nickel alloy. Over the tin-nickel alloy layer is a layer comprised of a non-precious refractory metal such as zirconium, titanium, hafnium or tantalum, preferably zirconium or titanium. Over the refractory metal layer is a sandwich layer comprised of a plurality of alternating layers of non-precious refractory metal such as zirconium, titanium, hafnium or tantalum, preferably zirconium or titanium, and non-precious refractory metal compound such as zirconium compound, titanium compound, hafnium compound or tantalum compound, preferably a titanium compound or a zirconium compound such as zirconium nitride or titanium nitride. Over the sandwich layer is a layer comprised of a non-precious refractory metal compound such as a zirconium compound, titanium compound, hafnium compound or tantalum compound, preferably a titanium compound or a zirconium compound such as a zirconium nitride or titanium nitride. A top layer comprised of reaction products of a non-precious refractory metal, preferably zirconium or titanium, oxygen and nitrogen is disposed over the refractory metal compound layer.

The nickel and tin-nickel alloy layer are generally applied by electroplating. The non-precious refractory metal, refractory metal compound and reaction products of refractory metal, oxygen and nitrogen layers are generally applied by vapor deposition processes such as sputter ion deposition.

DESCRIPTION OF THE PREFERRED EMBODIMENT

Figure 1:
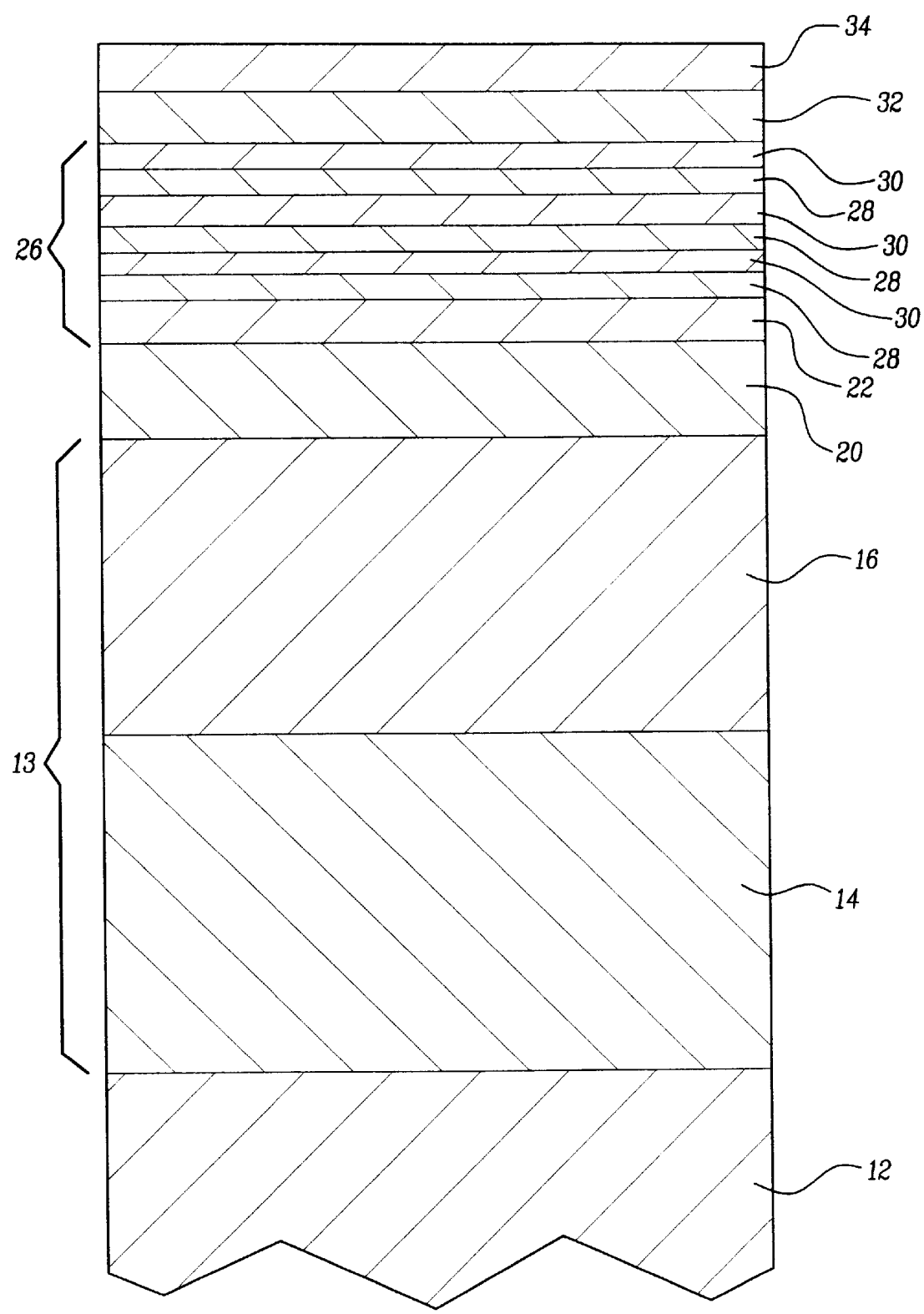
FIG. 1 is a cross-sectional view of a portion of the substrate having the multi-layer coating deposited on its surface.

The substrate 12 can be any platable metal or metallic alloy substrate such as copper, steel, brass, tungsten, nickel alloy, and the like. In a preferred embodiment the substrate is brass.

The nickel layer 13 is deposited on the surface of the substrate 12 by conventional and well known electroplating processes. These processes include using a conventional electroplating bath such as, for example, a Watts bath as the plating solution. Typically such baths contain nickel sulfate, nickel chloride, and boric acid dissolved in water. Chloride, sulfamate and fluoroborate plating solutions can also be used. These baths can optionally include a number of well known and conventionally used compounds such as leveling agents, brighteners, and the like. To produce specularly bright nickel layer at least one brightener from class I and at least one brightener from class II is added to the plating solution. Class I brighteners are organic compounds which contain sulfur. Class II brighteners are organic compounds which do not contain sulfur. Class II brighteners can also cause leveling and, when added to the plating bath without the sulfur-containing class I brighteners, result in semi-bright nickel deposits. These class I brighteners include alkyl naphthalene and benzene sulfonic acids, the benzene and naphthalene di- and trisulfonic acids, benzene and naphthalene sulfonamides, and sulfonamides such as saccharin, vinyl and allyl sulfonamides and sulfonic acids. The class II brighteners generally are unsaturated organic materials such as, for example, acetylenic or ethlenic alcohols, ethoxylated and propoxylated acetylenic alcohols, coumarins, and aldehydes. These class I and class II brighteners are well known to those skilled in the art and are readily commercially available. They are described, inter alia, in U.S. Pat. No. 4,421,611 incorporated herein by reference.

The nickel layer can be a monolithic layer comprised of semi-bright nickel, bright nickel, or it can be a duplex layer containing a layer comprised of semi-bright nickel and a layer comprised of bright nickel. The thickness of the nickel layer is generally in the range of from at least about 50 millionths (0.00005) of an inch, preferably at least about 150 millionths (0.000150) of an inch to about 3,500 millionths (0.0035) of an inch.

As is well known in the art before the nickel layer is deposited on the substrate the substrate is subjected to acid activation by being placed in a conventional and well known acid bath.

In one embodiment the nickel layer is a monolithic layer preferably comprised of bright nickel.

In another embodiment as illustrated in the Figure, the nickel layer 13 is actually comprised of two different nickel layers 14 and 16. Layer 14 is comprised of semi-bright nickel while layer 16 is comprised of bright nickel. This duplex nickel deposit provides improved corrosion protection to the underlying substrate. The semi-bright, sulfur-free plate 14 is deposited by conventional electroplating processes directly on the surface of substrate 12. The substrate 12 containing the semi-bright nickel layer 14 is then placed in a bright nickel plating bath and the bright nickel layer 16 is deposited on the semi-bright nickel layer 14.

The thickness of the semi-bright nickel layer and the bright nickel layer is a thickness effective to provide improved corrosion protection. Generally, the thickness of the semi-bright nickel layer is at least about 50 millionths (0.00005) of an inch, preferably at least about 100 millionths (0.0001) of an inch, and more preferably at least about 150 millionths (0.00015) of an inch. The upper thickness limit is generally not critical and is governed by secondary considerations such as cost. Generally, however, a thickness of about 1,500 millionths (0.0015) of an inch, preferably about 1,000 millionths (0.001) of an inch, and more preferably about 750 millionths (0.00075) of an inch should not be exceeded. The bright nickel layer 16 generally has a thickness of at least about 50 millionths (0.00005) of an inch, preferably at least about 125 millionths (0.000125) of an inch, and more preferably at least about 250 millionths (0.00025) of an inch. The upper thickness range of the bright nickel layer is not critical and is generally controlled by secondary considerations such as cost. Generally, however, a thickness of about 2,500 millionths (0.0025) of an inch, preferably about 2,000 millionths (0.002) of an inch, and more preferably about 1,500 millionths (0.0015) of an inch should not be exceeded. The bright nickel layer 16 also functions as a leveling layer which tends to cover or fill in imperfections in the substrate.

Disposed on the bright nickel layer 16 is a layer 20 comprised of tin-nickel alloy. More specifically, layer 20 is comprised of an alloy of nickel and tin. Layer 20 is deposited on layer 16 by conventional tin-nickel electroplating processes. These tin-nickel processes and plating baths are conventional and well known and are disclosed, inter alia, in U.S. Pat. Nos. 4,033,835; 4,049,508; 3,887,444; 3,772,168 and 3,940,319, all of which are incorporated herein by reference.

The tin-nickel alloy layer is preferably comprised of about 60–70 weight percent tin and about 30–40 weight percent nickel, more preferably about 65% tin and 35% nickel representing the atomic composition SnNi. The plating bath contains sufficient amounts of nickel and tin to provide a tin-nickel alloy of the afore-described composition.

A commercially available tin-nickel plating process is the NiColloy™ process available from ATOTECH, and described in their Technical Information Sheet No: NiColloy, Oct. 30, 1994, incorporated herein by reference.

The thickness of the tin-nickel alloy layer 20 is generally at least about 10 millionths (0.00001) of an inch, preferably at least about 20 millionths (0.00002) of an inch, and more preferably at least about 50 millionths (0.00005) of an inch. The upper thickness range is not critical and is generally dependent on economic considerations. Generally, a thickness of about 2,000 millionths (0.002) of an inch, preferably about 1,000 millionths (0.001), and more preferably about 500 millionths (0.0005) of an inch should not be exceeded.

Disposed over the tin-nickel alloy layer 20 is a layer 22 comprised of a non-precious refractory metal such as hafnium, tantalum, zirconium or titanium, preferably zirconium or titanium, and more preferably zirconium.

Layer 22 is deposited on layer 20 by conventional and well known techniques such as vacuum coating, physical vapor deposition such as ion sputtering, and the like. Ion sputtering techniques and equipment are disclosed, inter alia, in T. Van Borous, "Planar Magnetron Sputtering; A New Industrial Coating Technique", Solid State Technology, December 1976, pp 62–66; U. Kapacz and S. Schulz, "Industrial Application of Decorative Coatings—Principle and Advantages of the Sputter Ion Plating Process", Soc. Vac. Coat., Proc. 34th Arn. Techn. Conf., Philadelphia, U.S.A., 1991, 48–61; and U.S. Pat. Nos. 4,162,954 and 4,591,418, all of which are incorporated herein by reference.

Briefly, in the sputter ion deposition process the refractory metal such as titanium or zirconium target, which is the cathode, and the substrate are placed in a vacuum chamber. The air in the chamber is evacuated to produce vacuum conditions in the chamber. An inert gas, such as Argon, is introduced into the chamber. The gas particles are ionized and are accelerated to the target such as titanium or zirconium to dislodge titanium or zirconium atoms. The dislodged target material is then typically deposited as a coating film on the tin-nickel alloy coated substrate.

Layer 22 has a thickness which is generally at least about 0.25 millionths (0.00000025) of an inch, preferably at least about 0.5 millionths (0.0000005) of an inch, and more preferably at least about one millionth (0.000001) of an inch. The upper thickness range is not critical and is generally dependent upon secondary considerations such as cost. Generally, however, layer 22 should not be thicker than about 50 millionths (0.00005) of an inch, preferably about 15 millionths (0.000015) of an inch, and more preferably about 10 millionths (0.000010) of an inch.

In a preferred embodiment of the present invention layer 22 is comprised of titanium or zirconium, preferably zirconium, and is deposited by sputter ion plating.

Disposed over layer 22 is a sandwich layer 26 comprised of alternating layers 28 and 30 of a non-precious refractory metal compound and a non-precious refractory metal. Layer 26 generally has a thickness of from about 50 millionths (0.00005) of an inch to about one millionth (0.000001) of an inch, preferably from about 40 millionths (0.00004) of an inch to about two millionths (0.000002) of an inch, and more preferably from about 30 millionths (0.00003) of an inch to about three millionths (0.000003) of an inch.

The non-precious refractory metal compounds comprising layers 28 include a hafnium compound, a tantalum compound, a titanium compound or a zirconium compound, preferably a titanium compound or a zirconium compound, and more preferably a zirconium compound. These compounds are selected from nitrides, carbides and carbonitrides, with the nitrides being preferred. Thus, the titanium compound is selected from titanium nitride, titanium carbide and titanium carbonitride, with titanium nitride being preferred. The zirconium compound is selected from zirconium nitride, zirconium carbide and zirconium carbonitride, with zirconium nitride being preferred.

The nitride compounds are deposited by any of the conventional and well known reactive vacuum deposition processes including reactive ion sputtering. Reactive ion sputtering is generally similar to ion sputtering except that a gaseous material which reacts with the dislodged target material is introduced into the chamber. Thus, in the case where zirconium nitride comprises layers 28, the target is comprised of zirconium and nitrogen gas is the gaseous material introduced into the chamber.

Layers 28 generally have a thickness of at least about two hundredths of a millionth (0.00000002) of an inch, preferably at least about one tenth of a millionth (0.0000001) of an inch, and more preferably at least about five tenths of a millionth (0.0000005) of an inch. Generally, the layers 28 should not be thicker than about 25 millionths (0.000253) of an inch, preferably about 10 millionths (0.000010) of an inch, and more preferably about five millionths (0.000005) of an inch.

The layers 30 alternating in the sandwich layer 26 with the non-precious refractory metal compound layers 28 are comprised of a non-precious refractory metal such as described for layer 22. The preferred metals comprising layers 30 are titanium and zirconium with zirconium being more preferred.

Layers 30 are deposited by any of the conventional and well known vapor deposition processes such as sputter ion deposition.

Layers 30 have a thickness of at least about two hundredths of a millionth (0.00000002) of an inch, preferably at least about one tenth of a millionth (0.0000001) of an inch, and more preferably at least about five tenths of a millionth (0.0000005) of an inch. Generally, layers 30 should not be thicker than about 25 millionths (0.000025) of an inch, preferably about 10 millionths (0.000010) of an inch, and more preferably about five millionths (0.000005) of an inch.

The sandwich layer 26 comprised of multiple alternating layers 28 and 30 generally serves to, inter alia, reduce film stress, increase overall film hardness, improve chemical resistance, and realign the lattice to reduce pores and grain boundaries from extending through the entire film.

The number of alternating layers of metal 30 and metal nitride 28 in sandwich layer 26 is generally an amount effective to reduce stress and improve chemical resistance. Generally this amount is from about 50 to about two alternating layers 28, 30, preferably from about 40 to about four alternating layers 28, 30, and more preferably from about 30 to about six alternating layers 28, 30.

A preferred method of forming the sandwich layer 26 is by utilizing ion sputter plating to deposit a layer 30 of non-precious refractory metal such as zirconium or titanium followed by reactive ion sputter plating to deposit a layer 28 of non-precious refractory metal nitride such as zirconium nitride or titanium nitride.

Preferably the flow rate of nitrogen gas is varied (pulsed) during the reactive ion sputter plating between zero (no nitrogen gas is introduced) to the introduction of nitrogen at a desired value to form multiple alternating layers of metal 30 and metal nitride 28 in the sandwich layer 26.

The thickness proportionment of layers 30 to 28 is at least about 20/80, preferably 30/70, and more preferably 40/60. Generally, it should not be above about 80/20, preferably 70/30, and more preferably 60/40.

Disposed over the sandwich layer 26 is a layer 32 comprised of a non-precious refractory metal compound, preferably a non-precious refractory metal nitride, carbonitride, or carbide, more preferably a nitride.

Layer 32 is comprised of a hafnium compound, a tantalum compound, a titanium compound or a zirconium compound, preferably a titanium compound or a zirconium compound, and more preferably a zirconium compound. The compounds are selected from the nitrides, carbides, and carbonitrides. The preferred compounds are the nitrides with titanium nitride and zirconium nitride being preferred and zirconium nitride being the one preferred.

Layer 32 provides wear and abrasion resistance and the desired color or appearance, such as for example, polished brass. Layer 32 is deposited on layer 26 by way of the well known and conventional plating or deposition processes such as vacuum coating, reactive sputter ion plating, and the like. The preferred method is reactive ion sputter plating.

Layer 32 has a thickness at least effective to provide abrasion resistance. Generally, this thickness is at least 2 millionths (0.000002) of an inch, preferably at least 4 millionths (0.000004) of an inch, and more preferably at least 6 millionths (0.000006) of an inch. The upper thickness range is generally not critical and is dependent upon considerations such as cost. Generally a thickness of about 30 millionths (0.00003) of an inch, preferably about 25 millionths (0.000025) of an inch, and more preferably about 20 millionths (0.000020) of an inch should not be exceeded.

Zirconium nitride is the preferred coating material as it most closely provides the appearance of polished brass. By controlling the amount of nitrogen gas introduced into the reaction vessel during reactive ion sputtering the color of the zirconium nitride can be made similar to that of brass of various hues.

In one embodiment of the invention a layer 34 comprised of the reaction products of a non-precious refractory metal, an oxygen containing gas such as oxygen, and nitrogen is deposited onto the layer 32. The metals that may be employed in the practice of this invention are those which are capable of forming both a metal oxide and a metal nitride under suitable conditions, for example, using reactive gases comprised of oxygen and nitrogen. The metals may be, for example, tantalum, hafnium, zirconium and titanium, preferably titanium and zirconium, and more preferably zirconium.

The reaction products of the metal, oxygen and nitrogen are generally comprised of the metal oxide, metal nitride and metal oxy-nitride. Thus, for example, the reaction products of zirconium, oxygen and nitrogen comprise zirconium oxide, zirconium nitride and zirconium oxy-nitride.

The layer 34 can be deposited by a well known and conventional deposition technique, including reactive sputtering of a pure metal target or a composite target of oxides, nitrides and/or metals, reactive evaporation, ion and ion assisted sputtering, ion plating, molecular beam epitaxy, chemical vapor deposition and deposition from organic precursors in the form of liquids. Preferably, however, the metal reaction products of this invention are deposited by reactive ion sputtering.

These metal oxides and metal nitrides including zirconium oxide and zirconium nitride alloys and their preparation and deposition are conventional and well known and are disclosed, inter alia, in U.S. Pat. No. 5,367,285, the disclosure of which is incorporated herein by reference.

In another embodiment instead of layer 34 being comprised of the reaction products of a refractory metal, oxygen and nitrogen, it is comprised of non-precious refractory metal oxide. The refractory metal oxides of which layer 34 is comprised include, but are not limited to, hafnium oxide, tantalum oxide, zirconium oxide and titanium oxide, preferably titanium oxide and zirconium oxide, and more preferably zirconium oxide. These oxides and their preparation are conventional and well known.

The metal, oxygen and nitrogen reaction products or metal oxide containing layer 34 generally has a thickness effective to provide improved acid resistance. Generally this thickness is at least about five hundredths of a millionth (0.00000005) of an inch, preferably at least about one tenth of a millionth (0.0000001) of an inch, and more preferably at least about 0.15 of a millionth (0.00000015) of an inch. Generally, layer 34 should not be thicker than about five millionths (0.000005) of an inch, preferably about two millionths (0.000002) of an inch, and more preferably about one millionth (0.000001) of an inch.

In order that the invention may be more readily understood the following example is provided. The example is illustrative and does not limit the invention thereto.

EXAMPLE 1

Brass door escutcheons are placed in a conventional soak cleaner bath containing the standard and well known soaps, detergents, defloculants and the like which is maintained at a pH of 8.9–9.2 and a temperature of 180–200° F. for 30 minutes. The brass escutcheons are then placed for six minutes in a conventional ultrasonic alkaline cleaner bath. The ultrasonic cleaner bath has a pH of 8.9–9.2, is maintained at a temperature of about 160–180° F., and contains the conventional and well known soaps, detergents, defloculants and the like. After the ultrasonic cleaning the escutcheons are rinsed and placed in a conventional alkaline electro cleaner bath for about two minutes. The electro cleaner bath contains an insoluble submerged steel anode, is maintained at a temperature of about 140–180° F., a pH of about 10.5–11.5, and contains standard and conventional detergents. The escutcheons are then rinsed twice and placed in a conventional acid activator bath for about one minute. The acid activator bath has a pH of about 2.0–3.0, is at an ambient temperature, and contains a sodium fluoride based acid salt. The escutcheons are then rinsed twice and placed in a semi-bright nickel plating bath for about 10 minutes. The semi-bright nickel bath is a conventional and well known bath which has a pH of about 4.2–4.6, is maintained at a temperature of about 130–150° F., contains $NiSO_4$, $NiCL_2$, boric acid, and brighteners. A semi-bright nickel layer of an average thickness of about 250 millionths of an inch (0.00025) is deposited on the surface of the escutcheon.

The escutcheons containing the layer of semi-bright nickel are then rinsed twice and placed in a bright nickel plating bath for about 24 minutes. The bright nickel bath is generally a conventional bath which is maintained at a temperature of about 130–150° F., a pH of about 4.0–4.8, contains $NiSO_4$, $NiCL_2$, boric acid, and brighteners. A bright nickel layer of an average thickness of about 750 millionths (0.00075) of an inch is deposited on the semi-bright nickel layer.

The bright nickel plated escutcheons are rinsed twice and placed in a tin-nickel plating bath for about 7 ½ minutes. The bath is maintained at a temperature of about 120–140° F. and a pH of about 4.5–5.0. The bath contains stannous chloride, nickel chloride, ammonium bifluoride, and other well known and conventional complexing and wetting agents. A tin-nickel layer of an average thickness of about 200 millionths of an inch (0.0002) is deposited on the surface of the bright nickel layer.

The tin-nickel alloy plated escutcheons are placed in a sputter ion plating vessel. This vessel is a stainless steel vacuum vessel marketed by Leybold A.G. of Germany. The vessel is generally a cylindrical enclosure containing a vacuum chamber which is adapted to be evacuated by means of pumps. A source of argon gas is connected to the chamber by an adjustable valve for varying the rate of flow of argon into the chamber. In addition, two sources of nitrogen gas are connected to the chamber by an adjustable valve for varying the rate of flow of nitrogen into the chamber.

Two pairs of magnetron-type target assemblies are mounted in a spaced apart relationship in the chamber and connected to negative outputs of variable D.C. power supplies. The targets constitute cathodes and the chamber wall is an anode common to the target cathodes. The target material comprises zirconium.

A substrate carrier which carries the substrates, i.e., escutcheons, is provided, e.g., it may be suspended from the top of the chamber, and is rotated by a variable speed motor to carry the substrates between each pair of magnetron target assemblies. The carrier is conductive and is electrically connected to the negative output of a variable D.C. power supply.

The plated escutcheons are mounted onto the substrate carrier in the sputter ion plating vessel. The vacuum chamber is evacuated to a pressure of about $5 \times 10^{-3}$ millibar and is heated to about 400° C. via a radiative electric resistance heater. The target material is sputter cleaned to remove contaminants from its surface. Sputter cleaning is carried out for about one half minute by applying power to the cathodes sufficient to achieve a current flow of about 18 amps and introducing argon gas at the rate of about 200 standard cubic centimeters per minute. A pressure of about $3 \times 10^{-3}$ millibars is maintained during sputter cleaning.

The escutcheons are then cleaned by a low pressure etch process. The low pressure etch process is carried on for about five minutes and involves applying a negative D.C. potential which increases over a one minute period from about 1200 to about 1400 volts to the escutcheons and applying D.C. power to the cathodes to achieve a current flow of about 3.6 amps. Argon gas is introduced at a rate which increases over a one minute period from about 800 to about 1000 standard cubic centimeters per minute, and the pressure is maintained at about $1.1 \times 10^{-2}$ millibars. The escutcheons are rotated between the magnetron target assemblies at a rate of one revolution per minute. The escutcheons are then subjected to a high pressure etch cleaning process for about 15 minutes. In the high pressure etch process argon gas is introduced into the vacuum chamber at a rate which increases over a 10 minute period from about 500 to 650 standard cubic centimeters per minute (i.e., at the beginning the flow rate is 500 sccm and after ten minutes the flow rate is 650 sccm and remains 650 sccm during the remainder of the high pressure etch process), the pressure is maintained at about $2 \times 10^{-1}$ millibars, and a negative potential which increases over a ten minute period from about 1400 to 2000 volts is applied to the escutcheons. The escutcheons are rotated between the magnetron target assemblies at about one revolution per minute. The pressure in the vessel is maintained at about $2 \times 10^{-1}$ millibar.

The escutcheons are then subjected to another low pressure etch cleaning process for about five minutes. During this low pressure etch cleaning process a negative potential of about 1400 volts is applied to the escutcheons, D.C. power is applied to the cathodes to achieve a current flow of about 2.6 amps, and argon gas is introduced into the vacuum chamber at a rate which increases over a five minute period from about 800 sccm (standard cubic centimeters per minute) to about 1000 sccm. The pressure is maintained at about $1.1 \times 10^{-2}$ millibar and the escutcheons are rotated at about one rpm.

The target material is again sputter cleaned for about one minute by applying power to the cathodes sufficient to achieve a current flow of about 18 amps, introducing argon gas at a rate of about 150 sccm, and maintaining a pressure of about $3 \times 10^{-3}$ millibars.

During the cleaning process shields are interposed between the escutcheons and the magnetron target assemblies to prevent deposition of the target material onto the escutcheons.

The shields are removed and a layer of zirconium having an average thickness of about three millionths (0.000003) of an inch is deposited on the tin-nickel alloy layer of the escutcheons during a four minute period. This sputter deposition process comprises applying D.C. power to the cathodes to achieve a current flow of about 18 amps, introducing argon gas into the vessel at about 450 sccm, maintaining the pressure in the vessel at about $6\times10^{-3}$ millibar, and rotating the escutcheons at about 0.7 revolutions per minute.

After the zirconium layer is deposited the sandwich layer of alternating zirconium nitride and zirconium layers is deposited onto the zirconium layer. Argon gas is introduced into the vacuum chamber at a rate of about 250 sccm. D.C. power is supplied to the cathodes to achieve a current flow of about 18 amps. A bias voltage of about 200 volts is applied to the substrates. Nitrogen gas is introduced at an initial rate of about 80 sccm. The flow of nitrogen is then reduced to zero or near zero. This pulsing of nitrogen is set to occur at about a 50% duty cycle. The pulsing continues for about 10 minutes resulting in a sandwich stack with about six layers of an average thickness of about one millionth (0.000001) of an inch each. The sandwich stack has an average thickness of about six millionths (0.000006) of an inch.

After deposition of the sandwich layer of alternating layers of zirconium nitride and zirconium a layer of zirconium nitride having an average thickness of about 10 millionths (0.00001) of an inch is deposited on the sandwich stack during a period of about 20 minutes. In this step the nitrogen is regulated to maintain a partial ion current of about 6.3×10–11 amps. The argon, dc power, and bias voltage are maintained as above. Upon completion of the deposition of the zirconium nitride layer, a thin layer of the reaction products of zirconium, oxygen and nitrogen is deposited having an average thickness of about 0.25 millionths (0.00000025) of an inch during a period of about 30 seconds. In this step the introduction of argon is kept at about 250 sccm, the cathode current is kept at about 18 amps, the bias voltage is kept at about 200 volts and the nitrogen flow is set at about 80 sccm. Oxygen is introduced at a rate of about 20 sccm.

While certain embodiments of the invention have been described for purposes of illustration, it is to be understood that there may be various embodiments and modifications within the general scope of the invention.

We claim:

1. An article comprising a substrate having disposed on at least a portion of its surface a multi-layer coating comprising:

layer comprised of semi-bright nickel;

layer comprised of bright nickel;

layer comprised of tin-nickel alloy;

layer comprised of zirconium or titanium;

sandwich layer comprised of a plurality of alternating layers comprised of zirconium or titanium and of zirconium compound or titanium compound; and a layer comprised of zirconium compound or titanium compound.

2. The article of claim 1 wherein said layers comprised of zirconium or titanium are comprised of zirconium.

3. The article of claim 2 wherein said layers comprised of zirconium compound or titanium compound are comprised of zirconium compound.

4. The article of claim 3 wherein said zirconium compound is comprised of zirconium nitride.

5. The article of claim 1 wherein said substrate is comprised of brass.

6. An article comprising a substrate having on at least a portion of its surface a multi-layered coating comprising:

layer comprised of semi-bright nickel;

layer comprised of bright nickel;

layer comprised of tin-nickel alloy;

layer comprised of zirconium or titanium;

sandwich layer comprised of a plurality of alternating layers comprised of titanium or zirconium and of zirconium compound or titanium compound;

layer comprised of zirconium compound or titanium compound; and layer comprised of zirconium oxide or titanium oxide.

7. The article of claim 6 wherein said layers comprised of zirconium or titanium are comprised of zirconium.

8. The article of claim 7 wherein said layers comprised of zirconium compound or titanium compound are comprised of zirconium compound.

9. The article of claim 8 wherein said zirconium compound is zirconium nitride.

10. The article of claim 9 wherein said substrate is brass.

11. The article of claim 6 wherein said substrate is brass.

12. An article comprising a substrate having on at least a portion of its surface a multi-layer coating comprising:

layer comprised of nickel;

layer comprised of tin-nickel alloy;

layer comprised of zirconium or titanium;

plurality of alternating layers comprised of zirconium or titanium and of zirconium compound or titanium compound; and a layer comprised of zirconium compound or titanium compound.

13. The article of claim 12 wherein said layer comprised of nickel is comprised of bright nickel.

14. The article of claim 12 wherein said layers comprised of zirconium or titanium are comprised of zirconium.

15. The article of claim 14 wherein said layers comprised of zirconium compound or titanium compound are comprised of zirconium compound.

16. The article of claim 15 wherein said zirconium compound is comprised of zirconium nitride.

17. The article of claim 16 wherein said substrate is comprised of brass.

18. The article of claim 12 wherein said substrate is comprised of brass.

19. An article comprising a substrate having on at least a portion of its surface a multi-layered coating comprising:

layer comprised of nickel;

layer comprised of tin-nickel alloy;

layer comprised of zirconium or titanium;

sandwich layer comprised of a plurality of alternating layers comprised of titanium or zirconium and of zirconium compound or titanium compound;

layer comprised of zirconium compound or titanium compound; and layer comprised of zirconium oxide or titanium oxide.

20. The article of claim 19 wherein said first layer is comprised of bright nickel.

21. The article of claim 20 wherein said layers comprised of zirconium or titanium are comprised of zirconium.

22. The article of claim 21 wherein said layers comprised of zirconium compound or titanium compound are comprised of zirconium compound.

23. The article of claim 22 wherein said zirconium compound is zirconium nitride.

24. The article of claim 19 wherein said layers comprised of zirconium or titanium are comprised of zirconium.

25. The article of claim 24 wherein said layers comprised of zirconium compound or titanium compound are comprised of zirconium compound.

26. The article of claim 25 wherein said zirconium compound is zirconium nitride.

27. The article of claim 26 wherein said substrate is brass.

28. The article of claim 19 wherein said substrate is brass.

29. An article comprising a substrate having disposed on at least a portion of its surface a multi-layer coating comprising:

layer comprised of semi-bright nickel;

layer comprised of bright nickel;

layer comprised of tin-nickel alloy;

layer comprised of zirconium or titanium;

sandwich layer comprised of a plurality of alternating layers comprised of zirconium or titanium and of zirconium compound or titanium compound;

layer comprised of zirconium compound or titanium compound; and layer comprised of reaction products of zirconium or titanium, oxygen containing gas, and nitrogen.

30. The article of claim 29 wherein said layers comprised of zirconium or titanium are comprised of zirconium.

31. The article of claim 30 wherein said layers comprised of zirconium compound or titanium compound are comprised of zirconium compound.

32. The article of claim 31 wherein said zirconium compound is zirconium nitride.

33. The article of claim 32 wherein said layer comprised of reaction products of zirconium or titanium, oxygen containing gas, and nitrogen is comprised of reaction products of zirconium, oxygen containing gas, and nitrogen.

34. The article of claim 33 wherein said substrate is brass.

35. The article of claim 29 wherein said substrate is brass.

36. An article comprising a substrate having on at least a portion of its surface a multi-layer coating comprising:

first layer comprised of semi-bright nickel;

second layer comprised of bright nickel;

third layer comprised of tin-nickel alloy;

fourth layer comprised of zirconium or titanium;

fifth sandwich layer comprised of a plurality of alternating layers comprised of titanium or zirconium and of zirconium compound or titanium compound;

sixth layer comprised of zirconium compound or titanium compound; and seventh layer comprised of reaction products of zirconium or titanium, oxygen and nitrogen.

37. The article of claim 36 wherein said layers comprised of zirconium or titanium are comprised of zirconium.

38. The article of claim 37 wherein said layers comprised of zirconium compound or titanium compound are comprised of zirconium compound.

39. The article of claim 38 wherein said zirconium compound is zirconium nitride.

40. The article of claim 39 wherein said layer comprised of reaction products of zirconium or titanium, oxygen and nitrogen is comprised of reaction products of zirconium, oxygen and nitrogen.

41. The article of claim 40 wherein said substrate is brass.

42. The article of claim 36 wherein said substrate is brass.

43. An article comprising a substrate having on at least a portion of its surface a multi-layer coating comprising:

layer comprised of nickel;

layer comprised of tin-nickel alloy;

layer comprised of zirconium or titanium;

sandwich layer comprised of a plurality of alternating layers comprised of zirconium or titanium and of zirconium compound or titanium compound;

layer comprised of zirconium compound or titanium compound; and layer comprised of reaction products of zirconium or titanium, oxygen and nitrogen.

44. The article of claim 43 wherein said nickel layer is comprised of bright nickel.

45. The article of claim 44 wherein said layers comprised of zirconium or titanium are comprised of zirconium.

46. The article of claim 45 wherein said layers comprised of zirconium compound or titanium compound are comprised of zirconium compound.

47. The article of claim 46 wherein said zirconium compound is zirconium nitride.

48. The article of claim 47 wherein said layer comprised of reaction products of zirconium or titanium, oxygen and nitrogen is comprised of reaction products of zirconium, oxygen and nitrogen.

49. The article of claim 48 wherein said substrate is brass.

50. The article of claim 43 wherein said substrate is brass.

51. The article of claim 43 wherein said layers comprised of zirconium or titanium are comprised of zirconium.

52. The article of claim 51 wherein said layers comprised of zirconium compound or titanium compound are comprised of zirconium compound.

53. The article of claim 52 wherein said zirconium compound is zirconium nitride.

54. The article of claim 53 wherein said layer comprised of reaction products of zirconium or titanium, oxygen and nitrogen is comprised of reaction products of zirconium, oxygen and nitrogen.

55. An article comprising a substrate having on at least a portion of its surface a multi-layer coating comprising:

first layer comprised of nickel;

second layer comprised of tin-nickel alloy;

third layer comprised of zirconium or titanium;

fourth layer comprised of a plurality of alternating layers of zirconium or titanium and of zirconium compound or titanium compound;

fifth layer comprised of zirconium compound or titanium compound; and sixth layer comprised of reaction products of zirconium or titanium, oxygen and nitrogen.

56. The article of claim 55 wherein said nickel layer is comprised of bright nickel.

57. The article of claim 56 wherein said layers comprised of zirconium or titanium are comprised of zirconium.

58. The article of claim 57 wherein said layers comprised of zirconium compound or titanium compound are comprised of zirconium compound.

59. The article of claim 58 wherein said zirconium compound is zirconium nitride.

60. The article of claim 59 wherein said layer comprised of reaction products of zirconium or titanium is comprised of reaction products of zirconium, oxygen and nitrogen.

* * * * *